United States Patent [19]
Krishnamurthy et al.

[11] Patent Number: 5,844,424
[45] Date of Patent: Dec. 1, 1998

[54] PROGRAMMABLY BIDIRECTIONAL BUFFERED INTERCONNECT CIRCUIT

[75] Inventors: Sridhar Krishnamurthy; Shekhar Bapat, both of Santa Clara, Calif.

[73] Assignee: Xilinx, Inc., San Jose, Calif.

[21] Appl. No.: 808,095

[22] Filed: Feb. 28, 1997

[51] Int. Cl.$^6$ .............................................. H03K 19/0944

[52] U.S. Cl. ................................. 326/49; 326/86; 326/83; 326/57

[58] Field of Search ................................. 326/49, 50, 113, 326/83, 86, 56, 57, 58

[56] References Cited

U.S. PATENT DOCUMENTS

| | | | |
|---|---|---|---|
| 4,855,619 | 8/1989 | Hsieh et al. | 307/443 |
| 5,517,135 | 5/1996 | Young | 326/86 |

*Primary Examiner*—Michael J. Tokar
*Assistant Examiner*—Qui Van Duong
*Attorney, Agent, or Firm*—Jeanette S. Harms

[57] ABSTRACT

A programmable bidirectional interconnect circuit selectively provides either a buffered connection, a non-buffered connection, or a disconnection (tristate mode). The circuit includes six transistors coupled to a buffer and two signal lines.

2 Claims, 2 Drawing Sheets

PROGRAMMABLY BIDIRECTIONAL BUFFERED INTERCONNECT CIRCUIT

BACKGROUND OF THE INVENTION

1. Field of the Invention

The invention relates to programmable logic devices formed in integrated circuits, and particularly to programmably bidirectional buffered interconnect circuits used in those devices.

2. Description of the Related Art

Bidirectional buffer circuits are used in programmable logic devices for amplifying a signal on a line, wherein signal flow may be in either direction on the line. FIG. 1 illustrates a prior art bidirectional buffer circuit 100 including a buffer 105 and two memory cells M1 and M2 to provide a tristate mode and to control the direction of signal flow. Specifically, to provide a tristate mode, memory cells M1 and M2 store logic 0 signals, thereby turning on transistor 101 and applying the signal on line A to the input terminal of buffer 105. However, because no other transistors are on, buffer 105 neither drives line A nor line B. For one buffered connection, memory cell M1 stores a logic 0 signal and memory cell M2 stores a logic 1 signal, thereby turning on transistors 101 and 104 and amplifying the signal on line A to line B via buffer 105. On the other hand, if memory cell M1 stores a logic 1 signal and memory cell M2 stores a logic 0 signal, transistors 102 and 103 are on, thereby amplifying the signal on line B to line A via buffer 105. Thus, for either tristate or buffered operation of circuit 100, the input to buffer 105 is never left floating. (Note that memory cells M1 and M2 never store logic 1 signals at the same time. Otherwise, buffer 105 would attempt to drive both lines A and B, and produce contention with the signal intended to drive lines A or B.)

FIG. 2 illustrates another prior art bidirectional buffer circuit 100A in which transistor 101 (a p-channel transistor as shown in FIG. 1) is replaced by an n-channel transistor 201. In this embodiment, the signal for driving the gate of transistor 201 is taken from the inverted terminal of memory cell M1. Because all transistors for controlling circuit 100A are n-channel devices, circuit 100A is more compact than circuit 100. Other prior art bidirectional buffers are described in U.S. Pat. Nos. 4,695,740, 4,713,557, and 4,835,418 which are incorporated herein by reference.

However, in some applications which require more speed, even small delays, such as the delays provided by buffer 105 in circuits 100 and 100A, are undesirable. Therefore, a need arises for a bidirectional buffer circuit which also provides a non-buffered connection.

SUMMARY OF THE INVENTION

In accordance with the present invention, a bidirectional interconnect circuit programmably provides either a buffered connection, a non-buffered connection, or a disconnection (tristate mode). The circuit includes six transistors coupled to a buffer and two signal lines.

Specifically, in one embodiment, the circuit includes a buffer, a first transistor connected between a first signal line and an input terminal of the buffer, a transistor pair (including second and third transistors) connected between a second signal line and the input terminal of the buffer, a fourth transistor connected to the first signal line, a fifth transistor connected to the second signal line, and a sixth transistor connected to the output terminal of the buffer, the fourth transistor, and the fifth transistor. The first, second, fourth, and fifth transistors are controlled by a first memory device, whereas the third and sixth transistors are controlled by a second memory device.

In another embodiment, the circuit includes a buffer, a first transistor connected between a first signal line and an input terminal of the buffer, a transistor pair (including second and third transistors) connected to the second signal line, a fourth transistor connected to the first signal line, a fifth transistor connected between the second signal line and the input terminal of the buffer, and a sixth transistor connected to said output terminal of the buffer, the transistor pair, and the fourth transistor. In this embodiment, the first, second, fourth, and fifth transistors are controlled by a first memory device, whereas the third and sixth transistors are controlled by a second memory device.

DETAILED DESCRIPTION OF THE DRAWINGS

Figure 1:
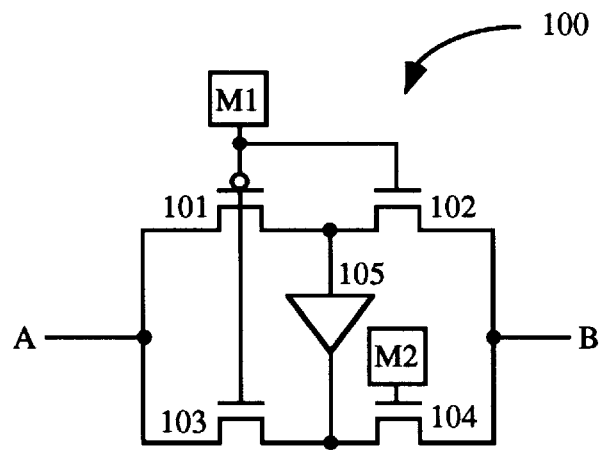
FIGS. 1 and 2 illustrate prior art tristate bidirectional buffer circuits.
Figure 2:
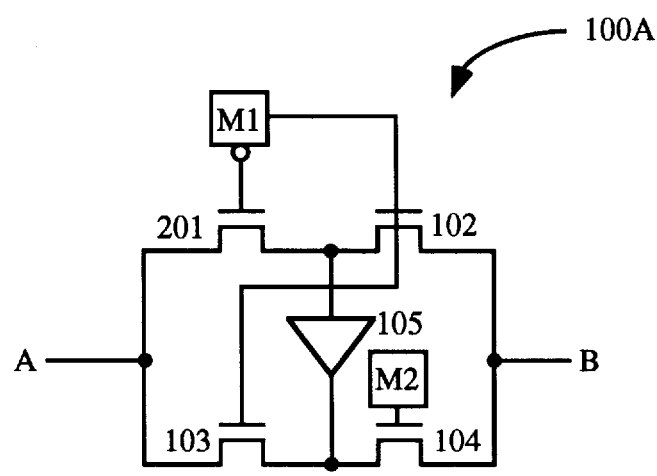
Figure 3:
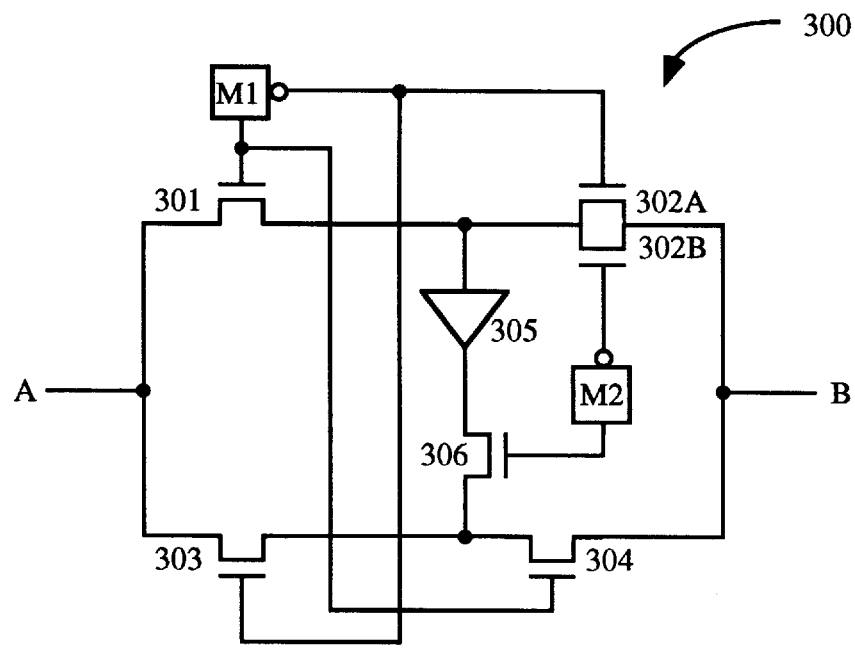
FIGS. 3 and 4 illustrate programmable bidirectional buffer interconnect circuits according to the present invention.

FIG. 3 illustrates a bidirectional buffered interconnect circuit 300 in accordance with the present invention which programmably provides a buffered connection, a tristate function, and a non-buffered connection.

To provide an amplified signal on line A to line B, memory cells M1 and M2 store logic 1 signals, thereby turning on transistors 301, 304, and 306. In this manner, buffer 305 amplifies the signal on line A and drives that amplified signal onto line B. On the other hand, to provide an amplified signal from line B to line A, memory cells M1 and M2 respectively store logic 0 and logic 1 signals, thereby turning on transistors 302A, 303, and 306. In a tristate mode, memory cells M1 and M2 store logic 0 signals, thereby turning on transistors 302A, 302B, and 303. In this manner, although a signal on line B is provided to the input terminal of buffer 305, non-conducting transistor 306 prevents buffer 305 from driving either line A or line B. Thus, line A is disconnected from line B. Finally, for a non-buffered connection, memory cells M1 and M2 respectively store logic 1 and logic 0 signals. In this manner, transistors 301, 302B, and 304 are turned on, thereby providing a non-buffered connection between lines A and B via transistors 301 and 302B. By bypassing buffer 305, a non-buffered connection significantly increases the speed of transferring a signal between lines A and B.

Figure 4:
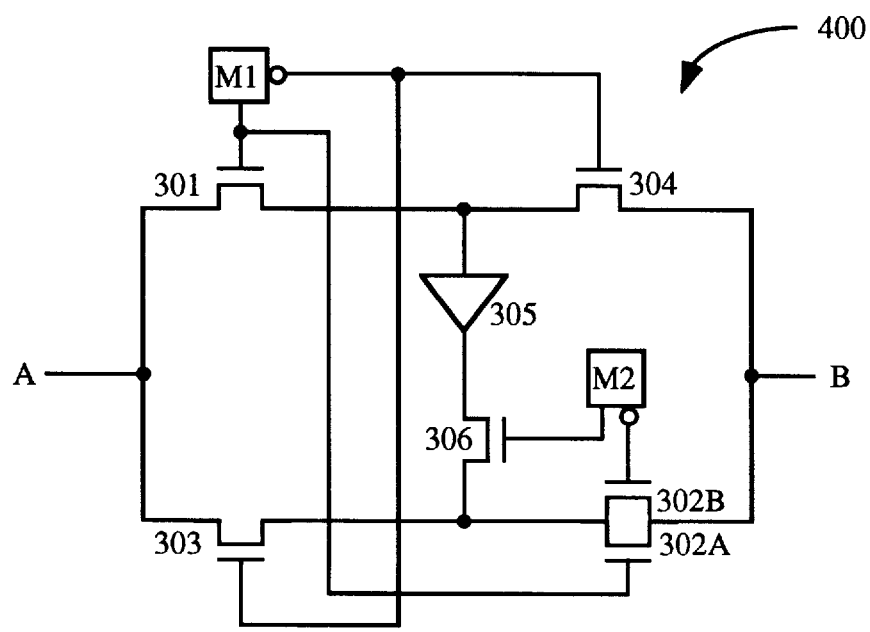

FIG. 4 shows another embodiment of a buffer circuit 400 in accordance with the present invention. Circuit 400 is similar in configuration to circuit 300, but the locations of transistor 304 and transistor pair 302A/302B are switched. Thus, to provide an amplified signal from line A to line B, memory cells M1 and M2 store logic 1 signals, thereby turning on transistors 301, 302A, and 306. To provide an amplified signal from line B to line A, memory cells M1 and M2 respectively store logic 0 and logic 1 signals, thereby turning on transistors 303, 304, and 306. For a tristate mode in circuit 400, memory cells M1 and M2 respectively store logic 1 and logic 0 signals, thereby turning on transistors 301, 302A, and 302B. In this manner, although a signal on line A is provided to the input terminal of buffer 305, non-conducting transistor 306 prevents buffer 305 from driving either line A or line B. Thus, line A is disconnected from line B. Finally, for a non-buffered connection in circuit 400, memory cells M1 and M2 store logic 0 signals. In this manner, transistors 302B, 303, and 304 are turned on, thereby providing a non-buffered connection between lines A and B via transistors 302B and 303.

In light of the above discussion, other embodiments of the invention will become obvious to those skilled in the art. For example, an n-channel transistor may be replaced with a p-channel transistor with an inverted control line, a transistor for controlling buffer direction may be replaced with a transmission gate, and a buffer may be replaced with an inverter. Moreover, although FIGS. 3–5 show memory cells for controlling the direction, other embodiments of the present invention provide signals derived from another source are used for controlling the buffer direction. Such other embodiments are intended to be included in the scope of the present invention which is defined solely by the appended claims.

We claim:

1. A programmable bidirectional interconnect circuit comprising:

a buffer having an input terminal and an output terminal;

first and second signal lines;

a first transistor connected between said first signal line and said input terminal of said buffer;

a transistor pair, including second and third transistors, connected between said second signal line and said input terminal of said buffer;

a fourth transistor connected to said first signal line;

a fifth transistor connected to said second signal line;

a sixth transistor connected to said output terminal of said buffer, said fourth transistor, and said fifth transistor;

first control means for controlling said first, second, fourth, and fifth transistors; and second control means for controlling said third and sixth transistors.

2. A programmable bidirectional interconnect circuit comprising:

a buffer having an input terminal and an output terminal;

first and second signal lines;

a first transistor connected between said first signal line and said input terminal of said buffer;

a transistor pair, including second and third transistors, connected to said second signal line;

a fourth transistor connected to said first signal line;

a fifth transistor connected between said second signal line and said input terminal of said buffer;

a sixth transistor connected to said output terminal of said buffer, said transistor pair, and said fourth transistor;

first control means for controlling said first, second, fourth, and fifth transistors; and second control means for controlling said third and sixth transistors.

* * * * *